(12) United States Patent
Yuasa

(10) Patent No.: US 8,604,490 B2
(45) Date of Patent: Dec. 10, 2013

(54) ORGANIC LIGHT-EMITTING DEVICE AND METHOD OF MANUFACTURING THE SAME

(75) Inventor: Hiroshi Yuasa, Kyoto (JP)

(73) Assignee: Panasonic Corporation, Osaka (JP)

( * ) Notice: Subject to any disclaimer, the term of this patent is extended or adjusted under 35 U.S.C. 154(b) by 49 days.

(21) Appl. No.: 13/043,872

(22) Filed: Mar. 9, 2011

(65) Prior Publication Data

US 2011/0210348 A1 Sep. 1, 2011

Related U.S. Application Data

(63) Continuation of application No. PCT/JP2010/001361, filed on Mar. 1, 2010.

(51) Int. Cl.
*H01L 29/18* (2006.01)

(52) U.S. Cl.
USPC ............ 257/88; 257/40; 257/99; 257/100; 438/85; 438/99; 438/22; 438/24; 438/46

(58) Field of Classification Search
USPC ........ 257/88, 40, 99, 100; 438/85, 99, 22, 24, 438/46–47
See application file for complete search history.

(56) References Cited

U.S. PATENT DOCUMENTS

| | | | |
|---|---|---|---|
| 5,443,922 A | | 8/1995 | Nishizaki et al. |
| 6,124,006 A * | | 9/2000 | Hekal ........................... 428/34.1 |
| 6,470,594 B1 * | | 10/2002 | Boroson et al. ................ 34/335 |
| 6,525,339 B2 * | | 2/2003 | Motomatsu ..................... 257/40 |
| 6,635,988 B1 * | | 10/2003 | Izumizawa et al. ........... 313/504 |
| 6,770,502 B2 | | 8/2004 | Cok et al. |
| 6,833,668 B1 * | | 12/2004 | Yamada et al. ................ 313/505 |
| 6,835,953 B2 | | 12/2004 | Cok et al. |
| 6,864,629 B2 | | 3/2005 | Miyaguchi et al. |
| 6,887,592 B2 | | 5/2005 | Hieda et al. |
| 7,045,822 B2 * | | 5/2006 | Tsuchiya ......................... 257/79 |
| 7,057,352 B2 * | | 6/2006 | Sakaguchi .................. 315/169.1 |
| 7,141,817 B2 * | | 11/2006 | Nishi et al. ...................... 257/40 |

(Continued)

FOREIGN PATENT DOCUMENTS

| | | |
|---|---|---|
| JP | 5-163488 | 6/1993 |
| JP | 10-114310 | 5/1998 |

(Continued)

OTHER PUBLICATIONS

International Search Report in PCT/JP2010/001361, dated May 25, 2010.

*Primary Examiner* — Fernando L Toledo
*Assistant Examiner* — Mohammed Shamsuzzaman
(74) *Attorney, Agent, or Firm* — Greenblum & Bernstein, P.L.C.

(57) ABSTRACT

An organic EL device includes a first substrate and a plurality of organic EL elements above a first portion of the first substrate. A first inorganic layer covers the plurality of organic EL elements. An active layer is above a second portion of the first substrate that is different than the first portion. The active layer comprises a material that is at least one of hygroscopic and oxidizable. A second inorganic layer covers the active layer. A second substrate is opposite the first substrate, with the plurality of organic EL elements being between the first and second substrates. A seal extends between the first and second substrates to define a sealed space between the first and second substrates. The second inorganic layer includes through-holes that expose the active layer to the sealed space that is defined by the first substrate, the second substrate, and the seal.

22 Claims, 8 Drawing Sheets

(56) References Cited

U.S. PATENT DOCUMENTS

| | | | |
|---|---|---|---|
| 7,187,118 B2 * | 3/2007 | Park et al. | 313/504 |
| 7,476,908 B2 * | 1/2009 | Yamazaki et al. | 257/93 |
| 7,508,130 B2 * | 3/2009 | Cok | 313/512 |
| 7,629,740 B2 * | 12/2009 | Sano et al. | 313/506 |
| 7,646,015 B2 * | 1/2010 | Fujii et al. | 257/40 |
| 7,768,060 B2 * | 8/2010 | Chung et al. | 257/316 |
| 7,804,241 B2 | 9/2010 | Toyoda et al. | |
| 7,843,136 B2 * | 11/2010 | Ishii et al. | 313/512 |
| 7,868,546 B2 * | 1/2011 | Kim et al. | 313/512 |
| 7,948,178 B2 * | 5/2011 | Cok | 313/512 |
| 8,030,646 B2 * | 10/2011 | Suzuki et al. | 257/40 |
| 2001/0004113 A1 * | 6/2001 | Motomatsu | 257/40 |
| 2003/0110981 A1 * | 6/2003 | Tsuruoka et al. | 106/252 |
| 2003/0164677 A1 | 9/2003 | Miyaguchi et al. | |
| 2003/0170496 A1 * | 9/2003 | Hieda et al. | 428/690 |
| 2003/0190763 A1 | 10/2003 | Cok et al. | |
| 2003/0203551 A1 | 10/2003 | Cok et al. | |
| 2004/0189191 A1 * | 9/2004 | Ohshita et al. | 313/504 |
| 2004/0201347 A1 * | 10/2004 | Park et al. | 313/512 |
| 2005/0116625 A1 * | 6/2005 | Park et al. | 313/504 |
| 2005/0140265 A1 * | 6/2005 | Hirakata | 313/483 |
| 2005/0140284 A1 * | 6/2005 | Im | 313/506 |
| 2005/0175841 A1 * | 8/2005 | Hikmet et al. | 428/411.1 |
| 2006/0022592 A1 * | 2/2006 | Boroson | 313/512 |
| 2006/0093795 A1 * | 5/2006 | Wang et al. | 428/195.1 |
| 2006/0128252 A1 * | 6/2006 | Menda et al. | 445/25 |
| 2006/0131573 A1 * | 6/2006 | Arai et al. | 257/40 |
| 2006/0138952 A1 * | 6/2006 | Yamaguchi | 313/512 |
| 2007/0111117 A1 * | 5/2007 | Noh et al. | 430/41 |
| 2007/0159068 A1 * | 7/2007 | Miyake | 313/504 |
| 2007/0172971 A1 * | 7/2007 | Boroson | 438/26 |
| 2008/0048557 A1 * | 2/2008 | Birnstock et al. | 313/504 |
| 2008/0064286 A1 * | 3/2008 | Park et al. | 445/25 |
| 2008/0142791 A1 * | 6/2008 | Kim et al. | 257/40 |
| 2009/0023232 A1 * | 1/2009 | Taniguchi et al. | 438/20 |
| 2009/0108748 A1 | 4/2009 | Toyoda et al. | |
| 2009/0134401 A1 * | 5/2009 | Maekawa | 257/72 |
| 2009/0169809 A1 * | 7/2009 | Yokoyama et al. | 428/138 |
| 2009/0295284 A1 * | 12/2009 | Park et al. | 313/504 |
| 2009/0321753 A1 * | 12/2009 | Yamazaki et al. | 257/88 |
| 2010/0194717 A1 * | 8/2010 | Mori et al. | 345/204 |
| 2010/0327275 A1 * | 12/2010 | Saito et al. | 257/40 |
| 2011/0049497 A1 * | 3/2011 | Ise | 257/40 |
| 2011/0114994 A1 * | 5/2011 | Mandlik et al. | 257/100 |
| 2012/0007067 A1 * | 1/2012 | Kaneta et al. | 257/40 |
| 2012/0056214 A1 * | 3/2012 | Sakakura et al. | 257/88 |
| 2012/0125431 A1 * | 5/2012 | Oizumi et al. | 136/256 |
| 2012/0126270 A1 * | 5/2012 | Yamazaki et al. | 257/98 |
| 2012/0133875 A1 * | 5/2012 | Nakayoshi et al. | 349/138 |
| 2012/0242937 A1 * | 9/2012 | Yamada et al. | 349/69 |
| 2012/0251772 A1 * | 10/2012 | Aoyama et al. | 428/138 |
| 2012/0256204 A1 * | 10/2012 | Yoshizumi et al. | 257/88 |
| 2012/0268002 A1 * | 10/2012 | Osako et al. | 313/504 |
| 2012/0298973 A1 * | 11/2012 | Adachi et al. | 257/40 |

FOREIGN PATENT DOCUMENTS

| | | |
|---|---|---|
| JP | 2000-223264 | 8/2000 |
| JP | 2000-260562 | 9/2000 |
| JP | 2001-068266 | 3/2001 |
| JP | 2001-167875 | 6/2001 |
| JP | 2001-176655 | 6/2001 |
| JP | 2003-264061 | 9/2003 |
| JP | 2003-297559 | 10/2003 |
| JP | 2005-216752 | 8/2005 |
| JP | 2007-103317 | 4/2007 |
| JP | 2007-265764 | 10/2007 |
| JP | 2009-110872 | 5/2009 |

* cited by examiner

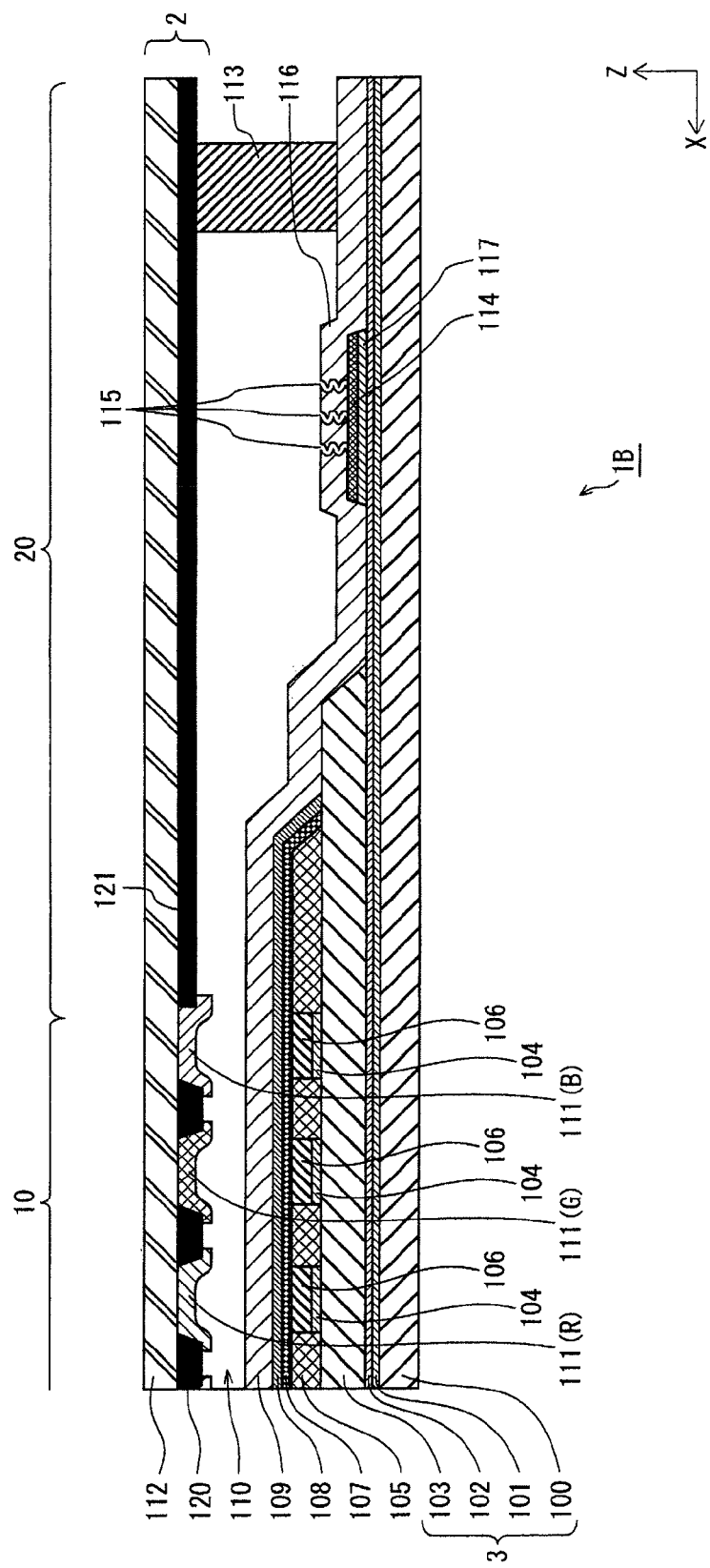

ORGANIC LIGHT-EMITTING DEVICE AND METHOD OF MANUFACTURING THE SAME

CROSS REFERENCE TO RELATED APPLICATION

This is a continuation application of PCT application No. PCT/JP2010/001361 filed Mar. 1, 2010, designating the United States of America, the disclosure of which, including the specification, drawings and claims, is incorporated herein by reference in its entirety.

BACKGROUND OF THE INVENTION

1. Field of the Invention

The present invention relates to an organic EL device including a plurality of organic EL elements and a method of manufacturing the same, and in particular to technology that suppresses time-dependent deterioration of the organic EL elements.

2. Description of the Related Art

In recent years, an organic EL device in which organic EL elements are disposed on a substrate has been studied and developed as a display device. The organic EL device has the following advantages, for example. Firstly, since the organic EL elements themselves emit light, the organic EL device having such organic EL elements has an excellent visibility. Secondly, since such organic EL elements are solid state components, the organic EL device has an excellent impact-resistance. With such advantages, the organic EL device has been widely used as a display of TV or a display of a compact electronic device such as a mobile telephone.

The organic EL element is a current-drive type light emitting element, and has a structure in which a light-emitting layer is provided between a pair of positive and cathodes. The light-emitting layer usually includes layers that are placed on top of each other. Examples of the layers are a hole-injection layer, a hole-transport layer, an electron-transport layer and an electron-injection layer as well as an organic light-emitting layer. Here, the organic light-emitting layer causes an electroluminescence phenomenon by a recombination of carriers.

When the organic EL device is in use, moisture and oxygen included in a surrounding environment of the device possibly enter the device. Unfortunately, each of layers that compose the light-emitting layer is often formed with use of a material that is weak in moisture and oxygen. These layers are possibly altered in reaction to the moisture and oxygen that have entered the device. This causes generation of a nonluminescent portion (dark spot) in a display area and a decrease in luminance, in some cases. In order to solve the problems, Patent Literatures 1 and 2, for example, disclose technology of protecting the light-emitting layer from moisture and oxygen that exist in the surrounding environment of the device.

FIG. 8 shows a sectional view of a main part of an organic EL device pertaining to the Patent Literature 2. A display unit 31 is provided on a supporting substrate 32. On the display unit 31, a plurality of organic EL elements are arranged in a matrix (hereinafter, the display unit 31 and the supporting substrate 32 are collectively referred to as an array substrate 33). A sealing substrate 34 is disposed opposite the array substrate 33. A sealing member 35 is formed to extend to seal a gap between the array substrate 33 and the sealing substrate 34 so that the display part 31 is protected from the surrounding environment of the device. Even if the sealing member 35 is formed to extend to seal a gap between the array substrate 33 and the sealing substrate 34, a factor such as time-dependent deterioration of the sealing member 35 causes moisture and oxygen to enter the device from the surrounding environment of the device in some cases. This possibly causes a deterioration of the light-emitting layer. Thus, a further countermeasure is taken of disposing a desiccant 36 in a recess 37 formed on an inner surface of the sealing substrate 34. Here, the desiccant 36 absorbs moisture and oxygen that have entered from the surrounding environment of the device.

3. Patent Literatures

[Patent Literature 1] Japanese Patent Application Publication No. 2000-223264.

[Patent Literature 2] Japanese Patent Application Publication No. 2007-103317.

SUMMARY OF INVENTION

In a hollow sealing structure as shown in Patent Literature 2, a method is adopted in which dry inert gas is filled in a sealed space formed by two substrates and a sealing member in order to suppress moisture and oxygen from entering the device. Therefore, a process of extending the sealing member to seal a gap between the substrates is performed under dry inert gas atmosphere. At this time, if a highly hygroscopic or oxidizable desiccant (i.e. highly-reactive desiccant) is used and disposed on an upper substrate (sealing substrate in Patent Literature 2), the desiccant possibly react to even a small amount of moisture and oxygen included in dry inert gas. In that case, a desiccative function of the desiccant has possibly been deteriorated before use of the device at which the desiccative function is desired. In this case, according to Patent Literature 2, it is necessary to use a low-reactive desiccant and increase the amount of the desiccant so as to support a desiccative function thereof. In that case, the more the amount of desiccant is increased, the larger a thickness of the desiccant becomes. This makes it difficult to make the organic EL device thinner.

The present invention has been achieved in view of the above problems, and an aim thereof is to provide an organic EL device that can be thinner than conventional organic EL device and a method of manufacturing the same.

One aspect of the present invention is an organic EL device comprising: a first substrate; a plurality of organic EL elements disposed on the first substrate; a first inorganic layer that covers the organic EL elements; an active layer that is formed using a material having at least one of hygroscopicity and oxidizability, and is disposed above an area of the first substrate, the area being an area on which the organic EL elements are not disposed; a second inorganic layer that covers the active layer; a second substrate disposed opposite the first substrate across the organic EL elements; and a sealing member that is formed to extend to seal a gap between the first and second substrates and to surround the organic EL elements and the active layer, wherein the active layer is exposed, via through-holes formed in the second inorganic layer, to a sealed space that is surrounded by the first substrate, the second substrate and the sealing member.

According to one aspect of the present invention, manufacturing processes may be adopted that flow as shown below, for example. Firstly, the second inorganic layer is formed so as to cover the active layer. Then, the sealing member is formed to extend to seal a gap between the first and second substrates. Subsequently, the through-holes are formed in the second inorganic layer so that the active layer is exposed to a sealed space formed by the sealing member, the first substrate and the second substrate. In this case, it is possible to prevent moisture and oxygen from being exposed to the active layer in a process of extending the sealing member to seal a gap between the first and second substrates. Therefore, a highly hygroscopic or oxidizable desiccant can be used as the active layer. Therefore, the active layer can keep on functioning as a desiccant until time of use of the device even if the size of the active layer is reduced. Thus, it is possible to provide a thinner organic EL device than the conventional organic EL device.

BRIEF DESCRIPTION OF THE DRAWINGS

FIG. 6 is a partial sectional view showing a structure of an organic EL device pertaining to a third embodiment;

DESCRIPTION OF THE PREFERRED EMBODIMENT(S)

Figure 1:
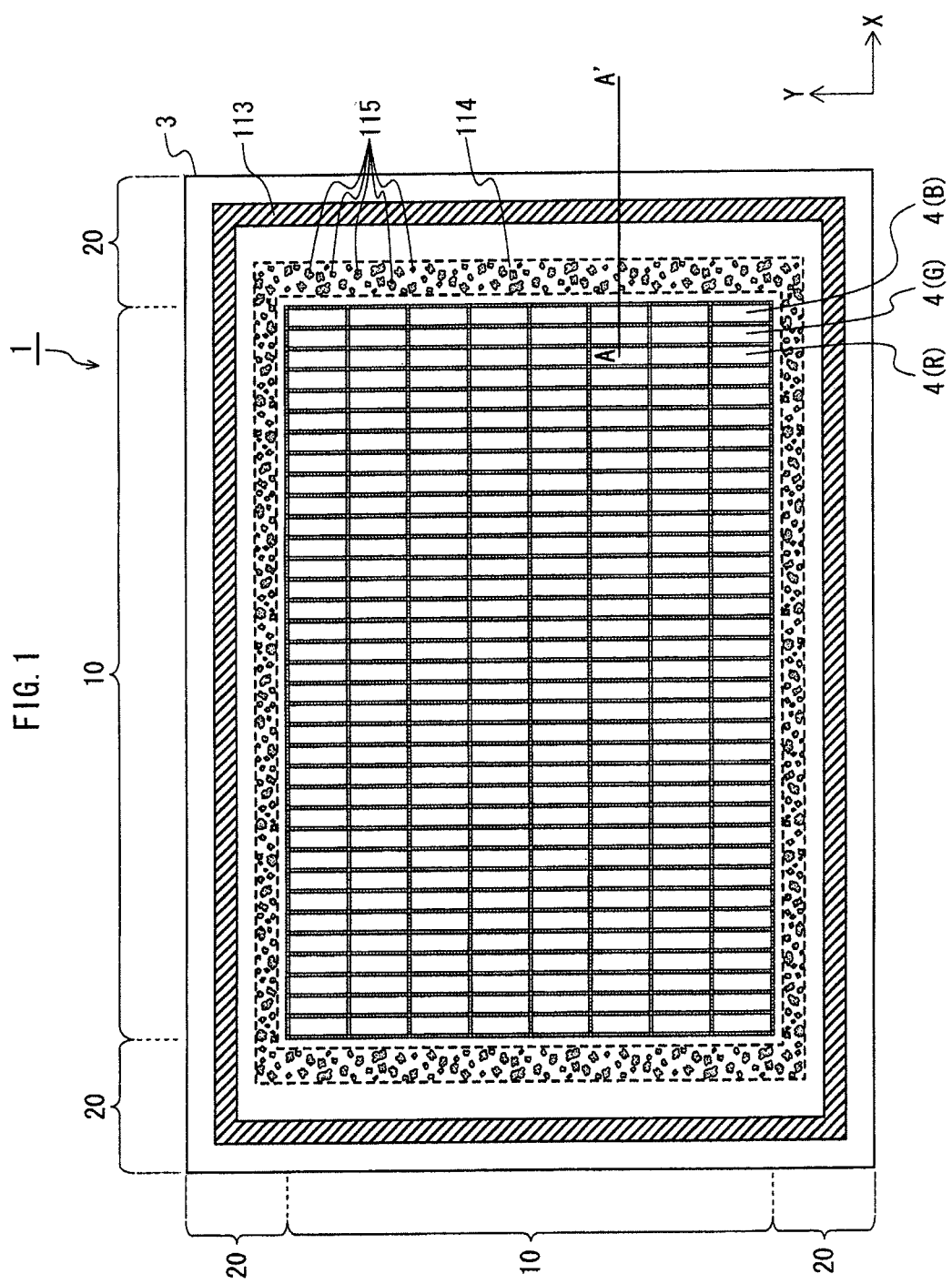
FIG. 1 is an elevation view showing a structure of an organic EL device pertaining to a first embodiment.

One aspect of the present invention is An organic EL device comprising: a first substrate; a plurality of organic EL elements disposed on the first substrate; a first inorganic layer that covers the organic EL elements; an active layer that is formed using a material having at least one of hygroscopicity and oxidizability, and is disposed above an area of the first substrate, the area being an area on which the organic EL elements are not disposed; a second inorganic layer that covers the active layer; a second substrate disposed opposite the first substrate across the organic EL elements; and a sealing member that is formed to extend to seal a gap between the first and second substrates and to surround the organic EL elements and the active layer, wherein the active layer is exposed, via through-holes formed in the second inorganic layer, to a sealed space that is surrounded by the first substrate, the second substrate and the sealing member.

With this structure, manufacturing processes may be adopted that flow as shown below, for example. Firstly, the second inorganic layer is formed so as to cover the active layer. Then, the sealing member is formed to extend to seal a gap between the first and second substrates. Subsequently, the through-holes are formed in the second inorganic layer so that the active layer is exposed to a sealed space formed by the sealing member, the first substrate and the second substrate. In this case, a highly hygroscopic or oxidizable desiccant can be used as the active layer. Therefore, the active layer can keep on functioning as a desiccant until time of use of the device even if the size of the active layer is reduced. Thus, it is possible to provide a thinner organic EL device than the conventional organic EL device.

According to another aspect of the present invention, each of the through-holes may be a through-crack.

With this structure, it is not necessary to form through-holes each having a predetermined size in the process of forming the through-holes.

Furthermore, according to another aspect of the present invention, the organic EL elements may be arranged in a matrix, and the active layer may be formed to extend to surround the organic EL elements.

The active layer is disposed so as to surround the organic EL elements. In this case, it is possible to effectively absorb, when the device is in use, moisture and oxygen that have entered from the surrounding environment, before moisture and oxygen reach a display area in which the organic EL elements are formed.

Also, according to another aspect of the present invention, the active layer may be formed using one of one selected from the group consisting of alkali metal, alkaline-earth metal, alkali metal oxide, alkaline-earth metal oxide, alkali metal fluoride and alkaline-earth metal fluoride, and an organic substance that includes one or more selected from the group, and has a charge transport property.

When the active layer is formed with use of such a material, the active layer can have remarkably high hygroscopicity or oxidizability.

Also, according to another aspect of the present invention, an organic EL device may comprise: a first substrate; a plurality of organic EL elements disposed on the first substrate; a first inorganic layer that covers the organic EL elements; an active layer that is formed using a material having at least one of hygroscopicity and oxidizability, and is disposed above an area of the first substrate, the area being an area on which the organic EL elements are not disposed; a second inorganic layer that covers the active layer; a second substrate disposed opposite the first substrate across the organic EL elements; and a sealing member that is formed to extend to seal a gap between the first and second substrates and to surround the organic EL elements and the active layer, wherein the active layer may be exposed, via through-holes formed in the second inorganic layer, to a sealed space that is surrounded by the first substrate, the second substrate and the sealing member, through the steps of: forming the second inorganic layer so as to cover the active layer, forming a sealing member to extend to seal the gap between the first and second substrates, an forming the through-holes in the second inorganic layer so as to expose the active layer to the sealed space via the through-holes.

According to such an aspect, execution is performed as follows. Firstly, the second inorganic layer is formed so as to cover the active layer. Then, the sealing member is formed to extend to seal a gap between the first and second substrates. Subsequently, the through-holes are formed in the second inorganic layer so that the active layer is exposed to a sealed space formed by the sealing member, the first substrate and the second substrate. In such a way, it is possible to prevent the active layer from being exposed to moisture and oxygen in the process of extending, under the dry inert gas atmosphere, the sealing member to seal a gap between the first substrate and the second substrate. In this case, a highly hygroscopic or oxidizable desiccant can be used as the active layer. Therefore, the active layer can keep on functioning as a desiccant until time of use of the device even if the size of the active layer is reduced. Thus, it is possible to provide a thinner organic EL device than the conventional organic EL device.

Also, another aspect of the present invention may comprise processes of: forming a plurality of organic EL elements on a first substrate; forming a first inorganic layer that covers the organic EL elements; forming an active layer above an area of the first substrate using a material having at least one of hygroscopicity and oxidizability, the area being an area on which the organic EL elements are not formed; forming a second inorganic layer so as to cover the active layer; forming a sealing member to extend to seal a gap between the first substrate and a second substrate, the second substrate being disposed opposite the first substrate across the organic EL elements; and forming through-holes in the second inorganic layer so that the active layer is exposed, via the through-holes, to a sealed space that is surrounded by the first substrate, the second substrate and the sealing member.

It is possible to protect the organic EL elements from moisture and oxygen by the process of forming the first inorganic layer that seals the organic EL elements. According to the above-described aspect, processes are executed as follows. Firstly, the second inorganic layer is formed so as to cover the active layer. Then, the sealing member is formed to extend to seal a gap between the first and second substrates. Subsequently, the through-holes are formed in the second inorganic layer so that the active layer is exposed to a sealed space formed by the sealing member, the first substrate and the second substrate. In such a way, it is possible to prevent the active layer from being exposed to moisture and oxygen in the process of extending, under the dry inert gas atmosphere, the sealing member to seal a gap between the first substrate and the second substrate. In this case, a highly hygroscopic or oxidizable desiccant can be used as the active layer. Therefore, the active layer can keep on functioning as a desiccant until time of use of the device even if the size of the active layer is reduced. Thus, it is possible to provide a thinner organic EL device than the conventional organic EL device.

Furthermore, according to another aspect of the present invention, the through-holes may be formed by irradiating the second inorganic layer with laser light.

It is possible to form the through-cracks in the second inorganic layer by irradiating the second inorganic layer with a laser light. The through-cracks can be used as the through-holes. Also, the through-holes can be formed by using laser light after the sealing member has extended to seal a gap between the first and second substrates.

According to another aspect of the present invention, the method of manufacturing the organic EL device may further comprise a process of forming, on an area of the first substrate, a thermally expandable layer that is formed using a material higher in thermal expansion than the second inorganic layer, the area being an area above which the active layer is to be formed, the process being executed after the first organic layer has been formed and before the active layer is formed.

With the thermally expandable layer disposed under the active layer, cracks in the thermally expandable layer are formed before cracks in the second inorganic layer are formed in the process of forming the through-holes by irradiation of laser light. Therefore, the though-holes can be formed with weaker laser light in this case than in a case where the thermally expandable layer is not formed. Thus, it is possible to reduce damage on a wiring etc. disposed above the first substrate.

Also, according to another aspect of the present invention, the method of manufacturing the organic EL device may further comprise a process of forming, on an area of the first substrate, a light reflective layer that is formed using a material having light reflectivity, the area being an area above which the active layer is to be formed, the process being executed after the first organic layer has been formed and before the active layer is formed.

With the light reflective accelerative layer disposed under the active layer, it is possible to reflect, towards the active layer, laser light that has entered the first substrate through the second inorganic layer and the active layer at the time of laser irradiation for forming the through-holes. Therefore, the though-holes can be formed with weaker laser light in this case than in a case where the thermally expandable layer is not formed. In addition, laser light that has entered the first substrate can be reflected. Therefore, it is possible to reduce damage on the wiring etc. disposed above the first substrate, compared to a case where the thermally expandable layer is used.

Here, the second inorganic layer may be formed using at least a material that absorbs light less than 500 nm in wavelength.

With this structure, laser light can be used for forming the through-holes.

Furthermore, according to another aspect of the present invention, the second substrate may be formed using at least a material that transmits light less than 500 nm in wavelength.

With this structure, the through-holes can be formed by irradiating the second substrate with laser light.

Also, according to another aspect of the present invention, each of the organic EL elements may include a first functional layer, the active layer and the first functional layer may be formed using a same material, the active layer and the first functional layer may be formed in a same process, the second inorganic layer and the first inorganic layer may be formed using a same material, and the second inorganic layer and the first inorganic layer may be formed in a same process.

When the processes are executed as shown in the above, the process of forming the active layer and the process of forming the second inorganic layer are not necessary. Therefore, it is possible to manufacture a thinner organic EL device without adding a new process to processes of manufacturing the conventional organic EL device. Also, the processes for manufacturing the organic EL elements are normally executed in a vacuum. Therefore, even when the highly hygroscopic or oxidizable desiccant is used as each of the first functional layer and the active layer, the desiccant can be handled safely.

According to another aspect of the present invention, the first functional layer may be an electron transport layer.

The electron transport layer is often formed with use of a material that is highly hygroscopic or oxidizable. Therefore, such a material can be used for forming the active layer.

Also, according to another aspect of the present invention, each of the organic EL elements may further include a second functional layer, the second functional layer may be formed, before the first functional layer is formed, using a material that is higher in thermal expansion than the first functional layer, the second functional layer and a thermally expandable layer may be formed, on an area of the first substrate, in a same process using a same material used for forming the second functional layer, the area being an area above which the active layer is to be formed, and the active layer may be formed on the thermally expandable layer.

With the thermally expandable layer disposed under the active layer, cracks in the thermally expandable layer are formed before cracks in the second inorganic layer are formed in the process of forming the through-holes by irradiation of laser light. Therefore, the though-holes can be formed with weaker laser light in this case than in a case where the thermally expandable layer is not formed. Thus, it is possible to reduce damage on a wiring etc. disposed above the first substrate. Furthermore, when the processes are executed as above, the thermally expandable layer can be formed without adding a new process to processes of manufacturing the conventional organic EL device.

According to another aspect of the present invention, each of the organic EL elements may further include a second functional layer, the second functional layer may be formed, before the first functional layer is formed, using a material having light reflectivity, the second functional layer and a light reflective layer may be formed, on an area of the first substrate, in a same process using a same material used for forming the second functional layer, the area being an area above which the active layer is to be formed, and the active layer may be formed on the light reflective layer.

With the light reflective layer disposed under the active layer, it is possible to reflect, towards the active layer, laser light that has entered the first substrate through the second inorganic layer and the active layer at the time of laser irradiation for forming the through-holes. Therefore, the though-holes can be formed with weaker laser light in this case than in a case where the light reflective layer is not formed. In addition, laser light that has entered the first substrate can be reflected. It is possible to reduce damage on the wiring etc. disposed above the first substrate, compared to a case where the light reflective layer is used. Furthermore, when the processes are executed as above, the light reflective layer can be formed without adding a new process to processes of manufacturing the conventional organic EL device.

Also, according to another aspect of the present invention, the second functional layer may be an electrode.

In the organic EL device, a material having a light reflectivity is usually used for forming one of a pair of electrodes that compose the light-emitting layer. Here, the one electrode is formed opposite a light takeoff side. Therefore, the one electrode can be formed with use of the material used for forming the light reflective layer.

According to another aspect of the present invention, the second inorganic layer may be formed using at least a material that absorbs light less than 500 nm in wavelength.

With this structure, it is possible to irradiate laser light from a side of the first substrate.

[First Embodiment]
Structural Outline

FIG. 1 is an elevation view showing a structure of an organic EL device pertaining to a first embodiment. An organic EL device 1 is a top-emission type display device. FIG. 1 shows a display surface of the organic EL device 1 from which a substrate (a second substrate 2 shown in FIG. 2) positioned on the display side (upper side) has been removed.

A plurality of organic EL elements 4(R), 4(G) and 4(B) are arranged in a matrix on a central area of a first substrate 3. The organic EL elements 4(R), 4(G) and 4(B) emit red light, green light and blue light, respectively. Each of the organic EL elements is a sub pixel. A combination of the three sub pixels composes one pixel. Note that the central area on which the organic EL elements 4 are formed is shown as a display area 10, and an area that surrounds the display area 10 is shown as a surrounding area 20, in FIGS. 1, 2, 4 and 6.

Figure 2:
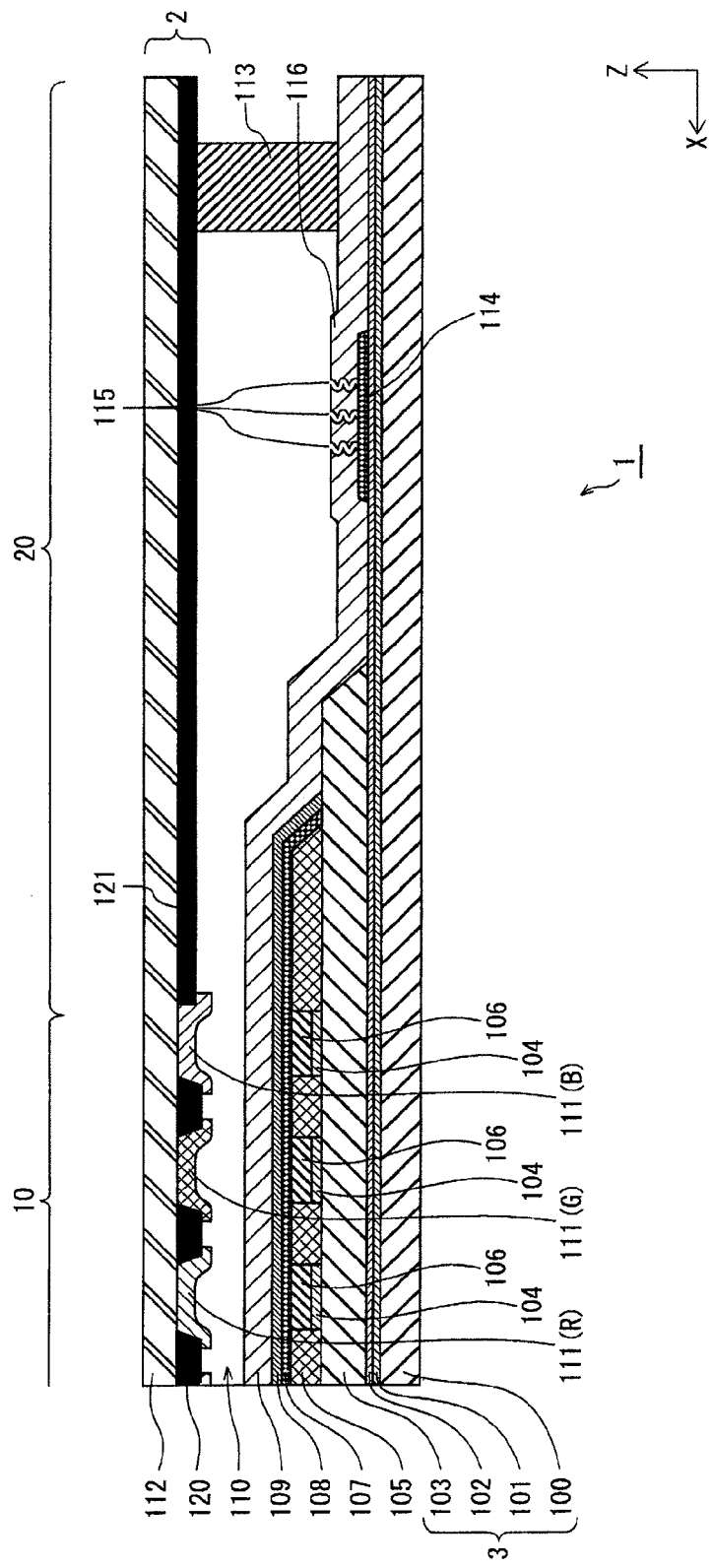
FIG. 2 is a partial sectional view showing the structure of the organic EL device pertaining to the first embodiment.

An active layer 114 is disposed in the surrounding area 20. Here, the active layer 114 is formed with use of a hygroscopic or oxidizable material, and has a function of absorbing moisture and oxygen that have entered from a surrounding environment of the organic EL device 1. It is not depicted that an inorganic layer (a second inorganic layer 116 shown in FIG. 2) is actually formed on the active layer 114 for the purpose of covering the active layer 114, and that a plurality of through-holes 115 are actually provided so as to pass through the second inorganic layer 116 when viewed cross-sectionally. Functions of the through-holes 115 are shown in detail with use of FIG. 2. A sealing member 113 is disposed in a peripheral area of the first substrate 3 so as to surround the active layer 114 and the organic EL elements 4. The sealing member 113 is formed to extend to seal a gap between the first substrate 3 and the second substrate 2 (FIG. 2). Note that the number of sealing members 113 of the present embodiment is not limited to one, and may be two or more in order to increase a sealing property of a sealed space 110 (FIG. 2).

FIG. 2 is a sectional view of A to A' in FIG. 1 (an X-Z sectional view along a horizontal direction of the organic EL device).

A wiring 101, a passivation layer 102, a planarizing layer 103, a reflective anode 104, a bank 105, an organic light-emitting layer 106, an electron transport layer 107, a transparent cathode 108 and a first portion of an inorganic layer referred to herein as a first inorganic layer 109, are layered above a surface of a TFT substrate 100 in the display area 10 in the stated order.

The wiring 101, the passivation layer 102, the active layer 114 and a second portion of the inorganic layer, referred to herein as the second inorganic layer 116, are layered in the surrounding area 20 in the stated order.

Note that the organic EL element 4 is composed of functional layers (i.e. the reflective anode 104, the bank 105, the light-emitting layer 106, the electron transport layer 107 and the transparent cathode 108). The organic EL element 4 may lack one of the above-stated functional layers, or may include any of functional layers such as a transparent conductive layer, a hole-injection layer and an electron-injection layer.

The TFT substrate 100 is a rear substrate of the organic EL device 1. The TFT substrate 100 may be formed with use of one of insulating materials such as alkali-free glass, soda glass, nonluminescent glass, phosphate glass, boric-acid glass, quartz, acrylic resin, styrene resin, polycarbonate resin, epoxy resin, polyethylene resin, polyester resin, silicon resin or alumina. Note that it is not depicted that TFTs (thin film transistors) are actually formed on the surface of the TFT substrate 100.

The wiring 101 is a wire that externally supplies electrical power to each TFT. The wiring 101 is connected to a drive circuit.

The passivation layer 102 is provided to cover the TFTs and the wiring 101 so as to protect them. Also, the passivation layer 102 is composed of at least one thin film such as SiO and/or SiN.

The planarizing layer 103 is provided to planarize an uneven surface of the TFT substrate 100. The uneven surface is caused due to formation of the wiring 101 and the passivation layer 102. The planarizing layer 103 is formed with use of an insulating material such as polyamide resin or acrylic resin.

Note that a portion of the first substrate 3 includes the TFT substrate 100, the wiring 101, the passivation layer 102 and the planarizing layer 103 in the present embodiment. Another portion of the first substrate 3 above which the planarizing layer 103 is not formed includes the TFT substrate 100, the wiring 101 and the passivation layer 102. However, the first substrate 3 may lack any of these layers, or further include another layer in the present embodiment.

The reflective anode 104 is formed with use of a light reflective material such as Al (aluminum), alloy of silver, palladium and copper, alloy of silver, rubidium and gold, MoCr (alloy of molybdenum and chrome) and NiCr (alloy of nickel and chrome) in addition to Ag (silver).

The bank 105 is provided to partition consecutive sub pixels. Thus, it is possible to prevent materials used for forming the organic light-emitting layer 106 of R, G and B colors from being mixed up with ink including solvent, in a wet process. Here, the wet process is performed with use of an inkjet device at the time of forming the light-emitting layer 106. A material used for forming the bank 105 may be selected from insulating organic materials such as acrylic resin, polyimide resin or novolac-type phenolic resin, for example.

Note that it is not depicted in FIG. 2 that known layers such as the transparent conductive layer and the hole-injection layer may be provided on a surface of the reflective anode 104. The transparent conductive layer may be formed with use of at least a material such as ITO (Indium Tin Oxide) and/or IZO (Indium Zinc Oxide). The hole-injection layer is formed with use of a material having a hole-injecting function. Examples of the material are metal oxide, metal nitride and metal oxynitride. Examples of the metal oxide are MoOx (Molybdenum Oxide), WOx (Tungsten Oxide) and Mox-WyOz (Molybdenum-tungsten Oxide).

The organic light-emitting layer 106 that emits one of the RGB colors is formed in each area partitioned by the bank 105.

The organic light-emitting layer 106 emits light, when in operation, by a recombination of carriers (a hole and an electron), and includes an organic material. Known materials may be used as the organic material. To give a concrete example, fluorescent materials disclosed in Japanese Patent Application Publication No. H5-163488 that can be used for the organic EL layer are: oxinoid compounds, perylene compounds, coumalin compounds, azacoumalin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes containing 8-hydroxyquinoline derivatives, metal complexes containing 2,2'-bipyridine derivatives, group III metal complexes containing Schiff base, metal complexes containing oxine, rare earth metal complexes, etc.

A known electron injection layer (not depicted) may be provided on the light-emitting layer 106.

The electron transport layer 107 has a function of transporting, to the organic light-emitting layer 106, an electron injected from the transparent cathode 108. The electron transport layer 107 may be formed with use of any of the following examples. The examples are: alkali metal such as lithium, sodium, potassium and cesium; alkaline-earth metal such as calcium and valium; alkali metal oxide such as sodium oxide, potassium oxide and cesium oxide; alkaline-earth metal oxide such as calcium oxide and valium oxide; alkali metal fluoride such as lithium fluoride, sodium fluoride and cesium fluoride; alkaline-earth metal fluoride such as calcium fluoride; magnesium oxide; phthalocyanine etc.; a combination of these; and an organic substance that includes any of the above-stated materials and has a charge-transport property.

The transparent cathode 108 is formed with use of at least a transparent material such as ITO (Indium Tin Oxide) and/or IZO (Indium Zinc Oxide).

The first inorganic layer 109 is provided in order to suppress the organic EL element 4 from deteriorating in reaction to moisture and air. The first inorganic layer 109 is formed with use of at least a material such as SiN (Silicon Nitride) and/or SiON (Silicon Oxynitride). When the organic EL device 1 is a top-emission type organic EL device, the first organic layer 109 needs to be formed with use of a light-transmitting material.

The sealing member 113 is formed to extend to seal a gap between the first substrate 3 and the second substrate 2 so as to form the sealed space 110. The sealed space 110 may be a space in which dry inert gas is filled or a space having pressure lower than air pressure. Also, various types of transparent resin materials (e.g. epoxy resin and silicon resin) may be filled in the sealed space 110, for example, so that moisture, oxygen etc. can freely enter the sealed space 110.

The active layer 114 is provided so as to absorb moisture and oxygen that have entered the sealed space 110 via the sealing member 113 and to prevent deterioration of the plurality of organic EL elements 4 provided in the display area 10. The active layer 114 may be formed with use of any of the following examples. The examples are: alkali metal such as lithium, sodium, potassium and cesium; alkaline-earth metal such as calcium and valium; alkali metal oxide such as sodium oxide, potassium oxide and cesium oxide; alkaline-earth metal oxide such as calcium oxide and valium oxide; alkali metal fluoride such as lithium fluoride, sodium fluoride and cesium fluoride; alkaline-earth metal fluoride such as calcium fluoride; oxide magnesium; phthalocyanine etc.; a combination of these; and an organic substance that includes any of the above-stated materials and has a charge-transport property. In the present embodiment, the active layer 114 is formed with use of the same material used for forming the electron transport layer 107. With such a structure, the active layer 114 and the electron transport layer 107 can be formed in the same process. Therefore, a process exclusively for forming the active layer 114 is not necessary. Note that the active layer 114 does not necessarily have to be formed with use of the same material used for forming the electron transport layer 107. The active layer 114 may be formed with use of the same material used for forming any of the functional layers composing the organic EL element 4.

The second organic layer 116 is provided for the purposes of suppressing the active layer 114 from reacting in response to hydrogen and oxygen and allowing the active layer to keep on functioning as a desiccant until the sealing member 113 is formed to extend to seal a gap between the first substrate 3 and the second substrate 2. In the present embodiment, the second organic layer 116 is formed with use of the same material used for forming the first organic layer 109. Also, the first organic layer 109 and the second organic layer 116 are formed integrally.

The sealing member 113 is formed to extend to seal a gap between the first substrate 3 and the second substrate 2 in peripheral areas of the first substrate 3 and the second substrate 2. Note that the sealing member 113 of the present embodiment may be formed on the second inorganic layer 116. When the second inorganic layer 116 is not formed to be long enough to reach the peripheral area of the first substrate 3, the sealing member 113 may be formed on the first substrate 3.

The through-holes 115 are formed so as to pass through the second inorganic layer 116 when viewed cross-sectionally. The active layer 114 is exposed to the sealed space 110 via the through-holes 115. Thus, it is possible to effectively absorb moisture and oxygen that have entered the sealed space 110 via the sealing member 113 before the moisture and oxygen reach the display area 10. The active layer 114 can absorb so-called outgas as well as moisture and oxygen that have entered from the surrounding environment of the organic EL device 1. Here, the outgas is impurity gas containing moisture, organic substance etc. that are generated from the organic materials used in the organic EL device 1.

Color filters 111 (R), (G) and (B) and black matrices 120 and 121 are disposed on one surface of a sealing substrate 112.

The sealing substrate 112 is provided on a display side of the organic EL device 1. The sealing substrate 112 can be formed with use of the same material used for forming the TFT substrate 100. However, in order to form the organic EL device 1 as a top-emission type organic EL device, it is required that the sealing substrate 112 has preferable transparency.

Each of the color filters 111 (R), 111(G) and 111 (B) is disposed so as to face a corresponding one of the organic light-emitting layers 106 included in the organic EL element formed on the first substrate 3. Each of the color filters 111 (R), 111 (G) and 111 (B) is a transparent layer that transmits a visible light having a wavelength corresponding to one of blue, green and red colors, and is formed with use of a known material such as a resin material (e.g. commercially-available product, color resist manufactured by JSR Corporation).

The black matrices 120 and 121 are black layers provided for the purposes of preventing light from reflecting on the display surface of the organic EL device 1, preventing incidence of light, and enhancing display contrast. The black matrices 120 and 121 are formed with use of ultraviolet curable resin material including black pigment having an excellent light absorbing property and an excellent light blocking property.

Note that the second substrate 2 includes the sealing substrate 112, the black matrices 120 and 121 and the color filters 111 in the present embodiment. The second substrate 2 may lack any of these layers or may further include another layer in the present embodiment.

As described in FIG. 1, the sealing member 113 is formed to extend to seal a gap between the sealing substrate 112 and the first substrate 3 in the peripheral areas of the sealing substrate 112 and the first substrate 3. The sealing member 113 is formed with use of a dense resin material, an example of which is silicon resin.

Manufacturing Method

FIGS. 3A, 3B, 3C, 3D and 3E show examples of processes of manufacturing the organic EL device 1.

Firstly, the TFT substrate 100 is prepared. Here, TFTs are formed on one surface of the TFT substrate 100. The wiring 101 is formed so that TFTs are connected via a wire. This substrate is placed in a chamber so as to form the passivation layer 102 in a thin-film method such as an evaporation method.

Next, the planarizing layer 103 is formed on the passivation layer 102 in a dispense method, for example. Then, the substrate is placed in the camber again so as to form the reflective anode 104 in a spattering method.

Next, the bank 105 is formed on the formed reflective anode 104 in the photolithographic method.

Next, ink is applied on the surface of the reflective anode 104 partitioned by the bank 105, with use of an inkjet device, in a wet process. In the ink, the material used for forming the organic light-emitting layer 106 is dispersed in solvent. After the application of the ink, the organic light-emitting layer 106 is formed by drying the ink.

Figure 3A:
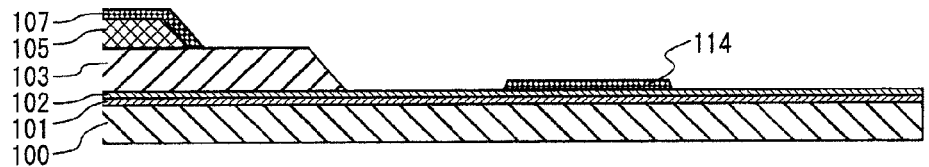
FIGS. 3A, 3B, 3C, 3D and 3E each show an example of a process of manufacturing the organic EL device pertaining to the first embodiment.

Next, the substrate is placed in the chamber so as to form the electron transport layer 107 on a surface of the formed light-emitting layer 106 based on the evaporation method. At this time, the active layer 114 is formed in the present embodiment. In this way, a process exclusively for forming the active layer 114 is not necessary. Note that the electron transport layer 107 and the active layer 114 are formed in the same process by simply changing masking patterns in a conventional manufacturing process. As a result, the substrate in a state as shown in FIG. 3A is formed.

Next, the transparent cathode 108 is formed on the surface of the electron transport layer 107 in the evaporation method.

Figure 3B:
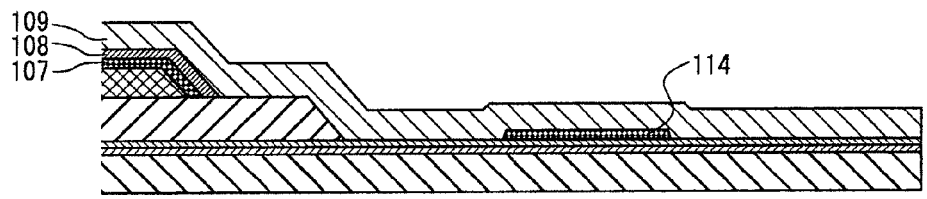

Next, a film is formed on the surface of the transparent cathode 108 in the evaporation method with use of at least a material such as SiN (Silicon Nitride) and/or SiON (Silicon Oxynitride) so as to form the first inorganic layer 109. At this time, the first inorganic layer 109 is formed so as to cover the active layer 114 in the surrounding area 20 as well as the display area 10. This allows the first inorganic layer 109 and the second inorganic layer 116 to be formed in the same process. As a result of this process, the substrate in a state as shown in FIG. 3B is formed. This process prevents deterioration of the organic EL elements 4 and the active layer 114 caused in response to a small amount of moisture and oxygen included in a manufacturing environment in the subsequent processes. In particular, it is possible to effectively prevent the active layer 114 from being exposed to moisture and oxygen in the after-mentioned process of extending the sealing member 13 to seal a gap between the first substrate 3 and the second substrate 2. Therefore, a highly hygroscopic or oxidizable desiccant can be used as the active layer 114. In this case, the active layer 114 can keep on functioning as a desiccant until the time of the use of the device even if the size of the active layer 114 is reduced.

Subsequently, the black matrices 120 and 121 and color filters 111 are layered on the sealing substrate 112. Note that the following manufacturing processes are preferably executed in a low-humidity and clean environment in order to prevent moisture, oxygen and outgas from attaching to the sealing substrate 112 and elements layered thereon.

Black matrix paste is applied on one surface of the sealing substrate 112. Here, the black matrix paste is a material that is used for forming the black matrices 120 and 121. Subsequently, a pattern mask having some openings is layered on an area in which the black matrices are to be disposed. Then, the surface of the sealing substrate on which the black matrix paste is applied and the pattern mask is layered is exposed to ultraviolet light so as to form the black matrices 120 and 121.

Next, color filter paste is applied on one surface of the substrate on which the black matrices 120 and 121 are formed. Here, the color filter paste is a material used for forming each of the color filters 111. After even removal of the solvent, a pattern mask having an opening is layered on an area in which one of the color filters is to be disposed. Then, the surface of the substrate on which the color filter paste is applied and the pattern mask is layered is exposed to ultraviolet light. Subsequently, the color filter paste is cured. Then, the pattern mask and the uncured color filter paste are removed to develop the cured color filter paste. This process is similarly executed with use of a color filter material of each color so as to form the color filters 111 (R), 111 (G) and 111 (B). Note that color filter products (e.g. color resist manufactured by JSR Corporation) that are commercially available may be adopted instead of forming the color filters with use of the color filter paste.

Figure 3C:
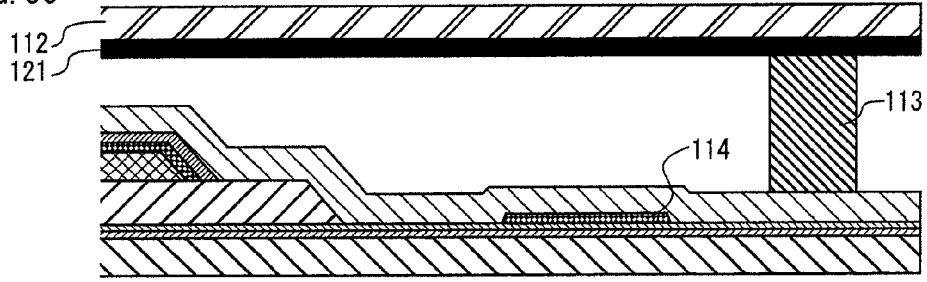
Figure 3D:
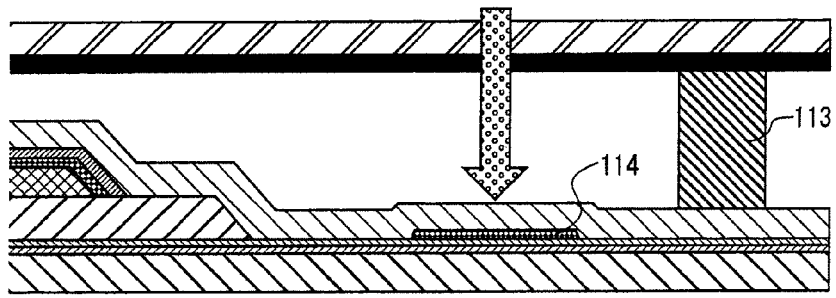

Next, the sealing member 113 in a paste state is applied in the peripheral area of the first substrate 3 or the second substrate 2 so as to seal a gap between the first substrate 3 and the second substrate 2. As a result, the substrate in a state as shown in FIG. 3C is formed.

Figure 3E:
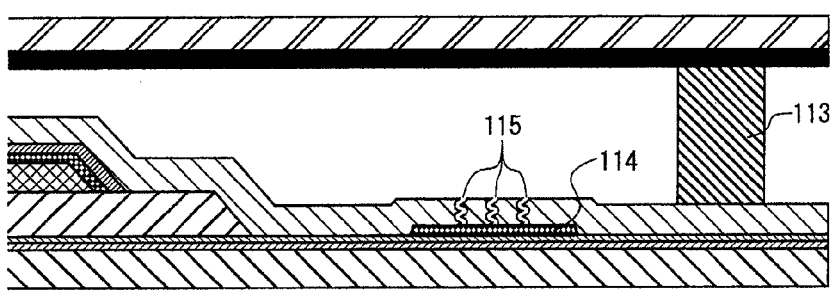

Next, laser irradiation is performed (FIG. 3D) to crack the second inorganic layer 116 so as to form the through-holes 115 (FIG. 3E). As a result, formation of the organic EL device 1 is completed.

It is described in the above that processes are executed in the following order in the present embodiment. Firstly, the active layer 114 is sealed by the second inorganic layer. Then, the sealing member 113 is formed to extend to seal a gap between the first substrate 3 and the second substrate 2. Subsequently, the active layer 114 is exposed by forming the through-holes 115 in the second inorganic layer 116. By executing the processes as above, a highly hygroscopic or oxidizable desiccant can be used as the active layer 114. In that case, even if the size of the active layer 114 is reduced, the active layer 114 can keep on functioning as a desiccant until time of use of the device at which the function of the desiccant is desired. Therefore, it is possible to provide a thinner organic EL device compared to a conventional organic EL device. Furthermore, according to the present embodiment, a conventional process exclusively for forming the desiccant is not necessary. Therefore, it is possible to obtain the thinner organic EL device without adding a new process to processes of manufacturing the conventional organic EL device.

[Second Embodiment]

In the first embodiment, the electron transport layer 107 and the active layer 114 are formed with use of the same material in one process. Also, the first inorganic layer 109 and the second inorganic layer 116 are formed with use of the same material in one process. In an organic EL device pertaining to a second embodiment, the electron transport layer 107 and the active layer 114, and the first inorganic layer 109 and the second inorganic layer 116 are not formed with use of the same materials, and are formed separately. The present embodiment is effective when layers composing the organic EL element 4 do not include a layer formed with use of the highly hygroscopic or oxidizable martial.

Structural Outline

Figure 4:
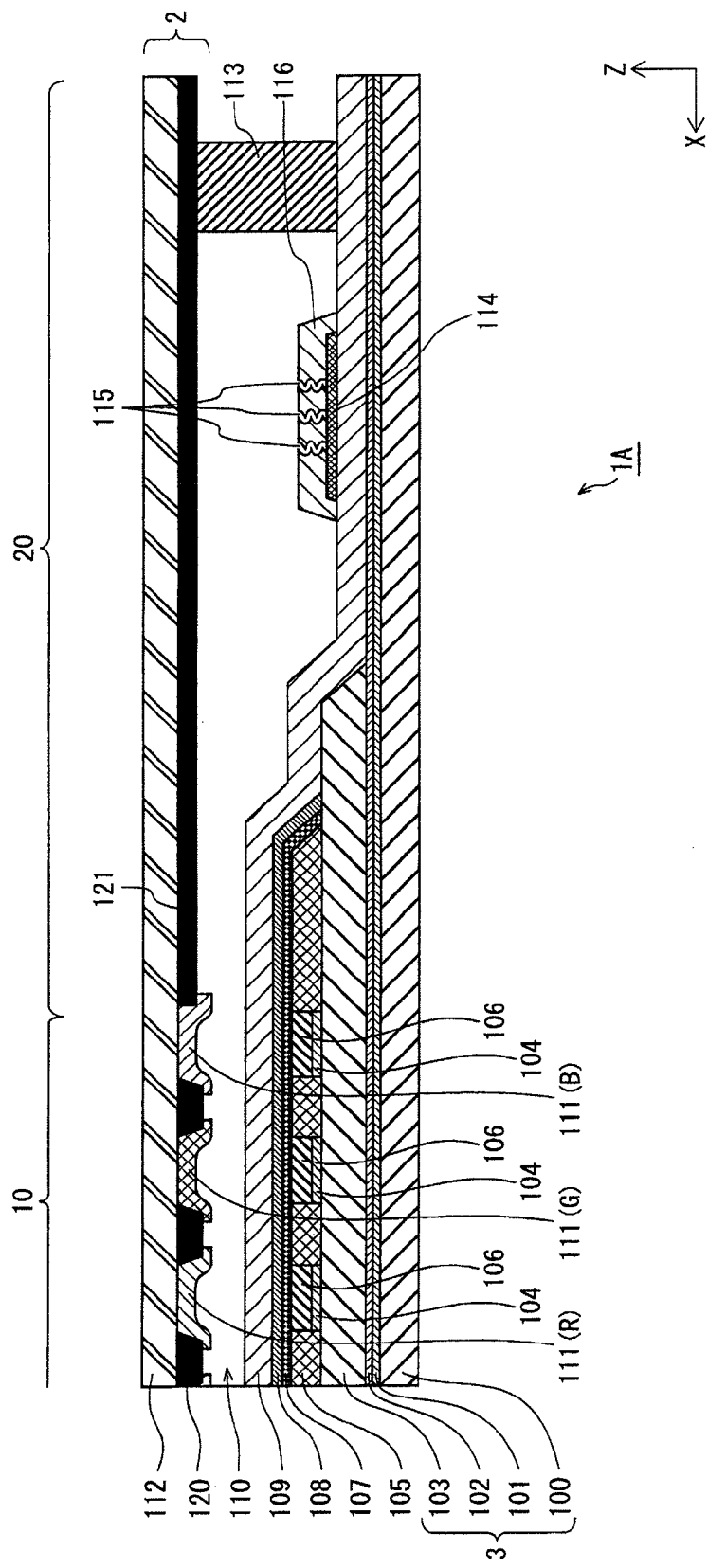
FIG. 4 is a partial sectional view showing the structure of the organic EL device pertaining to a second embodiment.

FIG. 4 is an X-Z sectional view of the organic EL device pertaining to the present embodiment along a horizontal direction.

Since the structure of the display area 10 is the same as that in the first embodiment, the description thereof is omitted.

The wiring 101, the passivation layer 102, the first inorganic layer 109, the active layer 114 and the second inorganic layer 116 are layered on the surrounding area 20 in the stated order.

Since the wiring 101, the passivation layer 102 and the first inorganic layer 109 are the same as those in the first embodiment, the descriptions thereof are omitted.

The active layer 114 in the present embodiment may be formed with use of a material different from a material used for forming the functional layers composing the organic EL element 4. It is preferable that the active layer 114 is formed with use of the highly hygroscopic or oxidizable martial as described in the above-described first embodiment.

The second inorganic layer 116 is provided for the purposes of suppressing the active layer 114 from reacting in response to hydrogen and oxygen, and allowing the active layer to keep on functioning as a desiccant until the sealing member 113 is formed to extend to seal a gap between the first substrate 3 and the second substrate 2. As shown in FIG. 4, the second inorganic layer 116 and the first inorganic layer 109 are not integrally formed, but are formed in separate processes as described in the following Manufacturing Method. Therefore, the second inorganic layer 116 may be formed with use of a material different from the material used for forming the first inorganic layer 109 in the present embodiment. The second inorganic layer 116 may be formed with use of the same material used for forming the first inorganic material 109 mentioned in the first embodiment. Examples of the materials are SiN (Silicon Nitride) and SiON (Silicon Oxynitride).

Manufacturing Method

FIGS. 5A, 5B, 5C, 5D, 5E, 5F and 5G are examples of manufacturing processes of an organic EL device 1A.

Firstly, the wiring 101, the passivation layer 102, the reflective anode 104, the bank 105, the organic light-emitting layer 106 and the electron transport layer 107 are layered on the TFT substrate 100 (FIG. 5A) in the stated order.

Figure 5A:
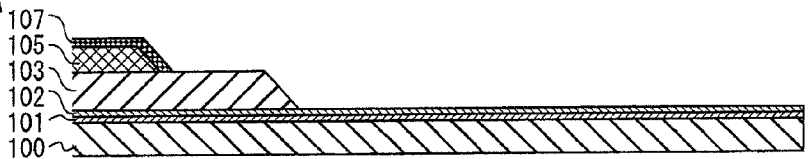
FIGS. 5A, 5B, 5C, 5D, 5E, 5F and 5G show examples of processes of manufacturing an organic EL device pertaining to the second embodiment.
Figure 5B:
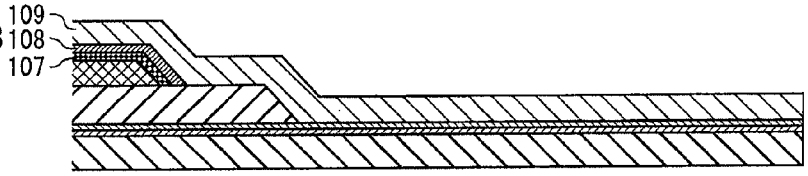

Next, the transparent cathode 108 and the first inorganic layer 109 are formed on the surface of the electron transport layer 107 (FIG. 5B).

Figure 5C:
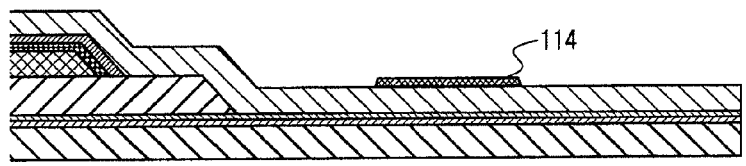

Next, the substrate is placed in the chamber so as to form the active layer 114 on the first inorganic layer 109 in the evaporation method (FIG. 5C).

Figure 5D:
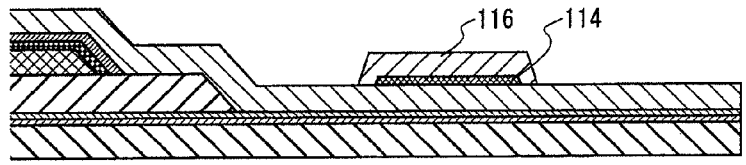
Figure 5E:
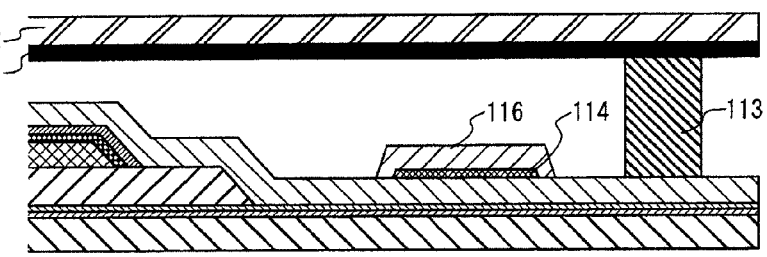
Figure 5F:
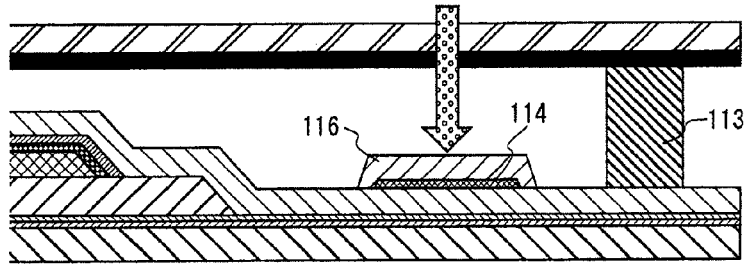

Next, the second inorganic layer 116 is formed on the active layer 114 in the evaporation method (FIG. 5D). As a result, it is possible to prevent the active layer 114 from being exposed to moisture and oxygen in the process of extending the sealing member 113 to seal a gap between the first substrate 3 and the second substrate 2 (FIG. 5E). Therefore, a highly hygroscopic or oxidizable desiccant can be used as the active layer 114. In this case, the active layer 114 can keep on functioning as a desiccant until time of use of the device even if the size of the active layer 114 is reduced.

The subsequent processes are the process of layering the black matrices 120 and 121 and the color filters 111 on the sealing substrate 112, and the process of extending the sealing member 113 to seal a gap between the first substrate 3 and the second substrate 2 (FIG. 5E). Since these processes are described in the above-stated first embodiment, the descriptions thereof are omitted.

Figure 5G:
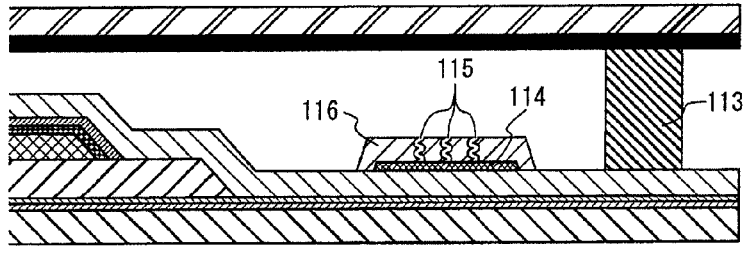

The sealing member 113 is formed to extend to seal a gap between the first substrate 3 and the second substrate 2. Then, the second inorganic layer 116 is irradiated with laser light (FIG. 5F) so as to form the through-holes 115 so as to pass through the second inorganic layer 116 when cross-sectionally viewed (FIG. 5G). As a result, formation of the organic EL device 1A is completed.

As described in the above, it is possible to prevent the active layer 114 from being exposed to moisture and oxygen in the process of extending the sealing member 113 to seal a gap between the first substrate 3 and the second substrate 2 under the dry inert gas atmosphere. Therefore, a highly hygroscopic or oxidizable desiccant can be used as the active layer 114. In this case, the active layer 114 can keep on functioning as a desiccant until time of use of the device even if the size of the active layer 114 is reduced. Thus, it is possible to provide a thinner organic EL device than the conventional organic EL device.

[Third Embodiment]

An organic EL device pertaining to a third embodiment has a structure in which energy necessary for forming the through-holes 115 can be reduced by providing an accelerative layer under the active layer 114. Here, the active layer 114 is formed with use of a material that is easily cracked by the laser irradiation or a light reflective material that reflects the laser light.

Structural Outline

FIG. 6 is an X-Z sectional view of the organic EL device pertaining to the present embodiment along a horizontal direction.

Since the structure of the display area 10 is the same as that in the first embodiment, the description thereof is omitted.

The wiring 101, the passivation layer 102, the accelerative layer 117, the active layer 114 and the second inorganic layer 116 are layered in the surrounding area 20 in the stated order.

The accelerative layer 117 is formed with use of a light reflective material that reflects the laser light or a material that is easily cracked by the laser irradiation. Hereinafter, the accelerative layer formed with use of the light reflective material that reflects the laser light is referred to as a "light reflective layer 117" while the accelerative layer formed with use of the material that is easily cracked by the laser irradiation is referred to as a "thermally expandable layer 117". In the present embodiment, the light reflective layer 117 is formed with use of the same material used for forming the reflective anode 104, for example.

The light reflective layer 117 is disposed under the active layer 114. This can reflect, towards the active layer 114, laser light that has entered the TFT substrate 100 through the second inorganic layer 116 and the active layer 114 at the time of forming the through-holes 115. Thus, energy is effectively transmitted to the second inorganic layer 116. With such a structure, it is possible to form the through-holes 115 with weaker laser light compared to a structure in which the light reflective layer 117 is not formed. Thus, it is possible to reduce damage on the wiring, for example, disposed on the TFT substrate 100. Furthermore, when the light reflective layer 117 is used, the laser light that has entered the TFT substrate 100 can be reflected. With such a structure, it is possible to reduce damage on the wiring 101, for example, disposed on the TFT substrate 100 compared to a structure in which the thermally expandable layer 117 is used.

In the present embodiment, the light reflective layer 117 is formed with use of the same material used for forming the reflective anode 104, as shown in FIG. 6. With such a structure, the light reflective layer 117 and the reflective anode 104 can be formed in the same process. Therefore, a process exclusively for forming the light reflective layer 117 is not necessary. Note that the light reflective layer 117 does not necessarily have to be formed with use of the reflective anode 104 in order to obtain such an effect. It is just required that the light reflective layer 117 is formed before formation of a layer formed with use of the same material used for forming the active layer 114, from among the functional layers composing the organic EL element 4.

When the thermally expandable layer 117 is used, on the other hand, the following is possible. When the laser light is irradiated in order to form the through-holes 115, the thermally expandable layer 117 is cracked before the second inorganic layer 116 is cracked. Impact caused by cracking the thermally expandable layer 117 can be transmitted to the second inorganic layer 116. With such a structure, it is possible to form the through-holes 115 with weaker laser light compared to a structure in which the thermally expandable layer is not formed. Thus, it is possible to further reduce damage on the wiring 101, for example, disposed on the TFT substrate 100.

It is preferable that the thermally expandable layer 117 is formed with use of the same material used for forming, from among the functional layers composing the organic EL element 4, a certain layer. Here, the certain layer is formed with use of the same material used for forming a layer that: is formed with use of the same material used for forming a layer formed before the formation of the active layer 114; and is formed with use of organic substances. Generally, the organic substances are higher in thermal expansion than inorganic substances. Also, many of the layers composing the organic EL element 4 are formed with use of the organic substances. Therefore, it is not necessary to make another consideration for a material to be used for forming the thermally expandable layer 117. Furthermore, by forming the thermally expandable layer 117 with use of the same material used for forming any of the functional layers composing the organic EL element 4, the thermally expandable layer 117 and the functional layer can be formed in the same process.

Manufacturing Method

The following describes examples of manufacturing processes of an organic EL device 1B. A description is given of manufacturing processes in which the reflective anode 104 is used as the light reflective layer 117.

Firstly, the wiring 101, the passivation layer 102 and the reflective anode 104 are layered on the TFT substrate 100 in the stated order.

Next, the reflective anode 104 is formed. At this time, a layer is also formed with use of the same material used for forming the reflective anode 104 in a portion of the surrounding area 20 in which the active layer 114 is to be formed. This layer is the light reflective layer 117. Thus, a process exclusively for forming the accelerative layer 117 is not necessary. Note that the reflective anode 104 and the light reflective layer 117 can be formed in the same process by changing the pattern masks used in the conventional process.

Next, the bank 105, the organic light-emitting layer 106 and the electron transport layer 107 are layered in the state order. The electron transport layer 107 and the active layer 114 are formed in the same process as with the first embodiment. Thus, the process exclusively for forming the active layer 114 is not necessary.

Next, a film is formed on the surface of the transparent cathode 108 in the evaporation method with use of at least a material such as SiN (Silicon Nitride) and/or SiON (Silicon Oxynitride) so as to form the first inorganic layer 109. At this time, the first inorganic layer 109 is formed so as to cover the active layer 114 in the surrounding area 20 as well as the display area 10. This allows the first inorganic layer 109 and the second inorganic layer 116 to be formed in the same process. This process prevents the active layer 114 from being exposed to moisture and oxygen in the process of extending the sealing member 113 to seal a gap between the first substrate 3 and the second substrate 2 in the subsequent processes.

The subsequent processes are the process of layering the black matrices 120 and 121 and the color filters 111 on the sealing substrate 112, and the process of extending the sealing member 113 to seal a gap between the first substrate 3 and the second substrate 2. Since these processes are described in the above-stated first embodiment, the descriptions thereof are omitted.

After a gap between the substrate 112 and the first substrate 3 has been sealed, the second inorganic layer 116 is irradiated with laser light. This forms the through-holes 115 that pass through the second inorganic layer 116 when viewed cross-sectionally. As a result, formation of the organic EL device 1B is completed.

It is described in the above that the through-holes 115 can be formed so as to pass through the second inorganic layer 116 when viewed cross-sectionally, with weak laser light by providing the accelerative layer 117, in the present embodiment. Therefore, it is possible to reduce damage on the wiring 101, for example, disposed on the TFT substrate 100. Furthermore, since the accelerative layer 117 is formed with use of the same material used for forming any of the functional layers composing the organic EL element 4, the accelerative layer 117 can be formed in one of the conventional processes of manufacturing the organic EL element.

Note that the present embodiment includes two structures. In one of the structures, one of the thermally expandable layer and the light reflective layer is formed. In the other structure, the thermally expandable layer is layered on the light reflective layer. Also, the present embodiment is not limited to the above-described manufacturing method. Therefore, the accelerative layer 117 may be formed in a separate process from processes of forming the organic EL element 4. In this case, the accelerative layer 117 may be formed with use of a material different from a material used for forming any of the functional layers composing the organic EL element 4.

Note that the organic EL devices 1, 1A and 1B described in the first to third embodiments are not limited to the top-emission type organic EL devices, and may be bottom-emission type organic EL devices.

[Display Device]

Figure 7:
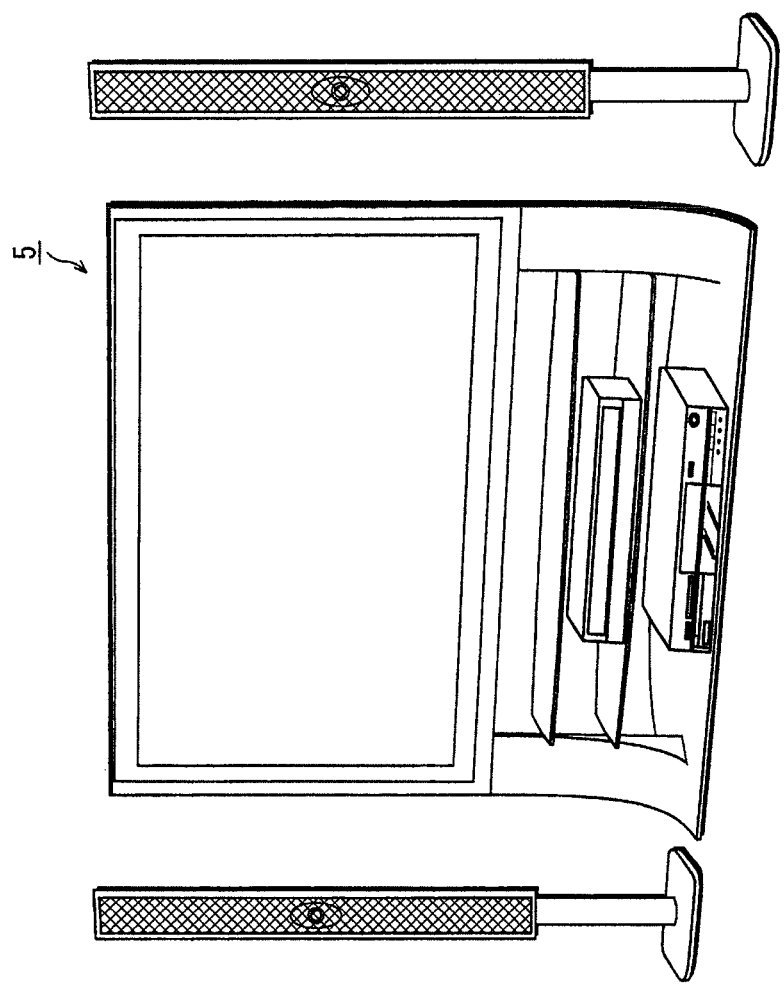
FIG. 7 is a perspective view showing an aspect of a display device 5.
Figure 8:
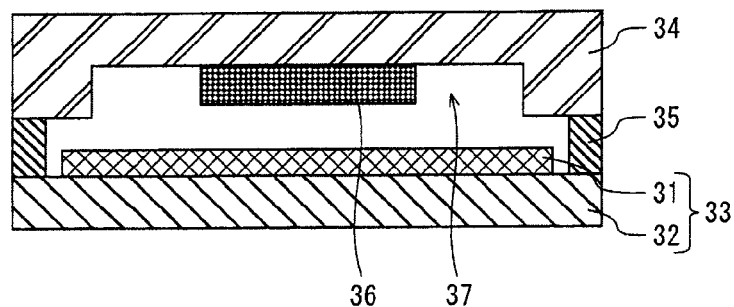
FIG. 8 is a sectional view of a conventional organic EL device.

Note that FIG. 7 shows an explanatory aspect of the display device 5 in which one of the organic EL devices 1, 1A and 1B that pertains to one aspect of the present invention is mounted.

[Industrial Applicability]

The organic EL devices of the present invention can be preferably used in various types of display devices, displays for TV, displays for portable electronic devices and the like that are for household, public and commercial use.

What is claimed is:

1. An organic EL device, comprising:
a first substrate;
a plurality of organic EL elements above a first portion of the first substrate;
a first portion of an inorganic layer that covers the plurality of organic EL elements;
an active layer above a second portion of the first substrate different than the first portion of the first substrate, the active layer comprising a material that is at least one of hygroscopic and oxidizable, the plurality of organic EL elements not being above the second portion of the first substrate;
a second portion of the inorganic layer that covers the active layer;
a second substrate opposite the first substrate, the plurality of organic EL elements being between the first substrate and the second substrate; and
a seal that extends between the first substrate and the second substrate to define a sealed space between the first substrate and the second substrate, wherein
the second portion of the inorganic layer includes through-holes that expose the active layer to the sealed space that is defined by the first substrate, the second substrate, and the seal.

2. The organic EL device of claim 1, wherein each of the through-holes comprises a through-crack.

3. The organic EL device of claim 1, wherein
the plurality of organic EL elements are arranged in a matrix, and
the active layer surrounds the plurality of organic EL elements.

4. The organic EL device of claim 1, wherein
the active layer comprises:
one of a group of an alkali metal, an alkaline-earth metal, an alkali metal oxide, an alkaline-earth metal oxide, an alkali metal fluoride, and an alkaline-earth metal fluoride; and
an organic substance that comprises one of the group and has a charge transport property.

5. An organic EL device, comprising:
a first substrate;
a plurality of organic EL elements above a first portion of the first substrate;
a first portion of an inorganic layer that covers the plurality of organic EL elements;
an active layer above a second portion of the first substrate different than the first portion of the first substrate, the active layer comprising a material that is at least one of hygroscopic and oxidizable, the plurality of organic EL elements not being above the second portion of the first substrate;
a second portion of the inorganic layer that covers the active layer;
a second substrate opposite the first substrate, the plurality of organic EL elements being between the first substrate and the second substrate; and
a seal that extends between the first substrate and the second substrate to define a sealed space between the first substrate and the second substrate, wherein
the second portion of the inorganic layer includes through-holes that expose the active layer to the sealed space that is defined by the first substrate, the second substrate, and the seal,
the second portion of the inorganic layer is formed above the active layer to cover the active layer,
the seal is formed between the first substrate and the second substrate to seal a gap between the first substrate and the second substrate, and
the through-holes are formed in the second portion of the inorganic layer to expose the active layer to the sealed space via the through-holes.

6. The organic EL device of claim 5, wherein each of the through-holes comprises a through-crack.

7. The organic EL device of claim 5, wherein
the plurality of organic EL elements are arranged in a matrix, and
the active layer surrounds the plurality of organic EL elements.

8. The organic EL device of claim 5, wherein
the active layer comprises:
one of a group of an alkali metal, an alkaline-earth metal, an alkali metal oxide, an alkaline-earth metal oxide, an alkali metal fluoride, and an alkaline-earth metal fluoride; and
an organic substance that comprises one of the group and has a charge transport property.

9. A method of manufacturing an organic EL device, comprising:
forming a plurality of organic EL elements above a first portion of a first substrate;
forming a first portion of an inorganic layer that covers the plurality of organic EL elements;
forming an active layer above a second portion of the first substrate different than the first portion of the first substrate with a material that is at least one of hygroscopic and oxidizable, the plurality of organic EL elements not being formed above the second portion of the first substrate;
forming a second portion of the inorganic layer that covers the active layer;
forming a seal that extends between the first substrate and a second substrate to define a sealed space between the first substrate and the second substrate, the second substrate being opposite the first substrate above the plurality of organic EL elements; and
forming through-holes in the second portion of the inorganic layer to expose the active layer, via the through-holes, to the sealed space defined by the first substrate, the second substrate, and the seal.

10. The method of manufacturing the organic EL device of claim 9, wherein the through-holes are formed by irradiating the second portion of the inorganic layer with a laser light.

11. The method of manufacturing the organic EL device of claim 10, further comprising:
forming, on the second area of the first substrate, a thermally expandable layer with a material that has a greater thermal expansion than a thermal expansion of the second portion of the inorganic layer after the first inorganic layer is formed and before the active layer is formed.

12. The method of manufacturing the organic EL device of claim 10, further comprising:
forming, on the second area of the first substrate, a light reflective layer with a material that reflects light after the first inorganic layer is formed and before the active layer is formed.

13. The method of manufacturing the organic EL device of claim 10, wherein the second portion of the inorganic layer comprises a material that absorbs light having a wavelength less than approximately 500 nm.

14. The method of manufacturing the organic EL device of claim 10, wherein the second substrate comprises a material that transmits light having a wavelength less than approximately 500 nm.

15. The method of manufacturing the organic EL device of claim 9, wherein
each of the plurality of organic EL elements includes a first functional layer,
the active layer and the first functional layer are formed with a same material,
the active layer and the first functional layer are formed in a same process,
the second portion of the inorganic layer and the first inorganic layer are formed with a same material, and
the second portion of the inorganic layer and the first inorganic layer are formed in a same process.

16. The method of manufacturing the organic EL device of claim 15, wherein the first functional layer comprises an electron transport layer.

17. The method of manufacturing the organic EL device of claim 15, wherein the through-holes are formed by irradiating the second portion of the inorganic layer with a laser light.

18. The method of manufacturing the organic EL device of claim 17, wherein
each of the plurality of organic EL elements further includes a second functional layer,
the second functional layer is formed before the first functional layer with a material that has a greater thermal expansion than a thermal expansion of the first functional layer,
the second functional layer and a thermally expandable layer are formed, on the second area of the first substrate, in a same process and with a same material as the second functional layer, and
the active layer is formed on the thermally expandable layer.

19. The method of manufacturing the organic EL device of claim 17, wherein
each of the plurality of organic EL elements further includes a second functional layer,
the second functional layer is formed before the first functional layer with a material that reflects light,
the second functional layer and a light reflective layer are formed, on the second area of the first substrate, in a same process and with a same material as the second functional layer, and
the active layer is formed on the light reflective layer.

20. The method of manufacturing the organic EL device of claim 17, wherein the second functional layer is an electrode.

21. The method of manufacturing the organic EL device of claim 9, wherein
the active layer comprises one of:
one of a group of an alkali metal, an alkaline-earth metal, an alkali metal oxide, an alkaline-earth metal oxide, an alkali metal fluoride, and an alkaline-earth metal fluoride, and
an organic substance that comprises one of the group and has a charge transport property.

22. The method of manufacturing the organic EL device of claim 17, wherein the second portion of the inorganic layer comprises a material that absorbs light having a wavelength less than approximately 500 nm.

* * * * *